US010431321B1

United States Patent
Yoo (10) Patent No.: US 10,431,321 B1
(45) Date of Patent: Oct. 1, 2019

(54) EMBEDDED TRANSCONDUCTANCE TEST CIRCUIT AND METHOD FOR FLASH MEMORY CELLS

(71) Applicant: Integrated Silicon Solution, (Cayman) Inc., Grand Cayman (KY)

(72) Inventor: Sung Jin Yoo, San Jose, CA (US)

(73) Assignee: Integrated Silicon Solutions, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/019,135

(22) Filed: Jun. 26, 2018

(51) Int. Cl.
G11C 16/04 (2006.01)
G11C 29/50 (2006.01)
G11C 16/14 (2006.01)

(52) U.S. Cl.
CPC .......... *G11C 29/50* (2013.01); *G11C 16/0433* (2013.01); *G11C 16/14* (2013.01); *G11C 2029/5002* (2013.01); *G11C 2029/5006* (2013.01)

(58) Field of Classification Search
CPC ..... G11C 29/50; G11C 16/14; G11C 16/0433; G11C 2029/5006; G11C 2029/5002
USPC ...................................... 365/185.29
See application file for complete search history.

(56) References Cited

U.S. PATENT DOCUMENTS

| | | | |
|---|---|---|---|
| 7,545,679 B1 * | 6/2009 | Eguchi .................. | G11C 29/50 365/185.09 |
| 2003/0074152 A1 * | 4/2003 | Kessenich ............ | G11C 29/50 702/117 |
| 2005/0057968 A1 * | 3/2005 | Lutze .................. | G11C 16/349 365/185.18 |

* cited by examiner

*Primary Examiner* — Tha-O H Bui
(74) *Attorney, Agent, or Firm* — Patent Law Works LLP (57) ABSTRACT

A transconductance test method implemented in a flash memory device detects memory cells with low transconductance and provides an output identifying memory cells, if any, having been classified as having a low transconductance (low $g_m$). In some embodiments, the transconductance test method implements multi-step testing using a pair of gate bias levels for each test step. Accurate detection of memory cells with low transconductance can be realized.

18 Claims, 8 Drawing Sheets

EMBEDDED TRANSCONDUCTANCE TEST CIRCUIT AND METHOD FOR FLASH MEMORY CELLS

FIELD OF THE INVENTION

The invention relates to memory devices and, in particular, to a method in a memory device to detect for cells with low transconductance characteristics.

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

In a non-volatile memory cell implemented using a floating gate MOS device, programming of the memory cell, or writing data to the memory cell, is accomplished by transferring charge carriers from the semiconductor substrate (the source or the drain) to the floating gate by tunneling through the thin gate oxide layer. Typically, a block of non-volatile memory cells is first erased by applying bias conditions to remove the charges stored on the floating gate. Then, the non-volatile memory cells can be written or programmed, usually one byte or word at a time, by applying the bias conditions opposite to the erase operation. Erase and programming operation of non-volatile memory devices require a relatively large voltage and current and erase and programming cycles can be slow.

Transconductance is a measure that relates the current through the output of a device to the voltage across the input of the device. In an MOS device, the transconductance ($g_m$) measures the ability of the MOS device to amplify an input voltage signal (the gate voltage) to provide an output current signal (the drain current). For a Flash memory cell, the transconductance ($g_m$) measures the change in the drain current of the floating gate MOS device, also referred to as the cell current $I_{cell}$, to the change in gate voltage ($V_{GS}$) over a small interval on the cell-current-versus-gate-voltage curve.

Transconductance is an important electrical parameter for flash memory devices having impacts on the reliability of the flash memory devices. It is often necessary to ensure a certain level of reliability for the flash memory devices, especially for flash memory devices used in automotive applications. To guarantee a certain life time for the flash memory devices, flash memory devices with low transconductance (low $g_m$) memory cells are screened out, typically during the wafer sort process. Low $g_m$ memory cells are not desirable as the low $g_m$ memory cells can cause over-erase problem in normal $g_m$ memory cells. Over-erased memory cells may suffer from read failure after successive program-erase cycles, negatively impacting the reliability of the flash memory device.

While it is necessary to screen out low $g_m$ memory cells in order to guarantee the reliability of a flash memory, detecting low $g_m$ memory cells is challenging as it is difficult to distinguish a memory cell with low transconductance from a memory cell with a lower erase threshold voltage.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a hardware processor or a processor device configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to aspects of the present invention, a flash memory device incorporates an embedded transconductance test module implementing a transconductance test method to detect memory cells with low transconductance and to provide an output identifying memory cells, if any, having been classified as having a low transconductance (low $g_m$). In embodiments of the present invention, the transconductance test method implements multi-step testing using a pair of gate bias levels for each test step. In this manner, accurate low transconductance detection can be realized and memory cells with low transconductance can be identified while distinguishing from memory cells that merely have low erase threshold voltage.

The embedded transconductance test module of the present invention implemented in the flash memory device realizes many advantages. First, the embedded transconductance test module is capable of identifying low $g_m$ memory cells in the flash memory device to allow flash memory devices with low $g_m$ memory cells to be screened out, thereby improving the reliability of the flash memory device. In some cases, repair may be performed on the flash memory device based on the detection result. In particular, over the life time of a flash memory device, the memory cells in the flash memory device degrade and the memory cells tend to shift to lower output cell current. Low $g_m$ memory cells with degraded cell currents are more difficult to erase. When the flash memory device includes low $g_m$ memory cells, the flash memory device may need to perform repeated erase operation in order for the low $g_m$ memory cells to be properly erased. However, the normal $g_m$ memory cells become degraded by the repeated erase operations and normal $g_m$ memory cells may become over erased. The embedded transconductance test module screens out low $g_m$ memory cells effectively to avoid the over-erase issue and improves the reliability of the flash memory device.

Second, the transconductance screening is typically performed during the wafer sort process, the conventional screening methods uses the wafer sort tester to test each memory cell of the flash memory device. The tester-driven transconductance screening is slow and imposes a large memory burden on the wafer sort tester as the tester has to store read out values from each memory cells of the array. On the other hand, the embedded transconductance test module of the present invention is incorporated or embedded into the flash memory device and the transconductance testing is performed solely within the flash memory device itself. The embedded transconductance test module can perform the transconductance testing very quickly and without imposing memory burden on the wafer sort tester. The embedded transconductance test module of the present invention represents a marked improvement over traditional wafer sort transconductance testing schemes.

Figure 1:
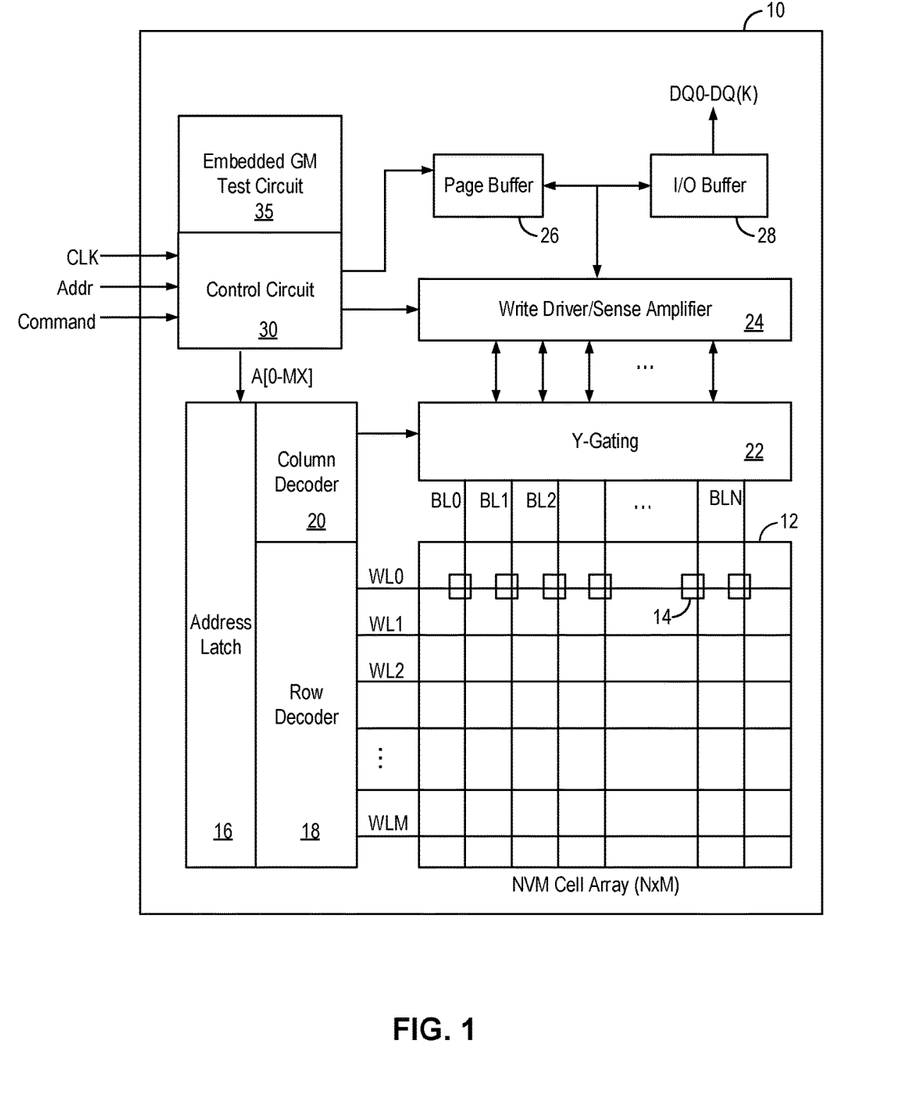
FIG. 1 is a block diagram of a non-volatile memory (NVM) device in one exemplary embodiment.

FIG. 1 is a block diagram of a non-volatile memory (NVM) device in one exemplary embodiment. FIG. 1 is illustrative only and the NVM device may include additional elements not shown in FIG. 1. Referring to FIG. 1, the NVM device 10 includes a two-dimensional array 12 of non-volatile memory cells 14. In the present embodiment, NVM device 10 is implemented as a flash memory device and non-volatile memory cells 14 are implemented as flash memory cells. In other embodiments, the NVM device 10 may be implemented as other types of non-volatile memory device.

In embodiments of the present invention, flash memory cells 14 may be configured as a NAND flash memory array or a NOR flash memory array. The cell array 12 is addressed by a row decoder 18 and a column decoder 20 to selectively access the memory cells 14 for read, program (write) and erase operations. In particular, an address A[0-MX] is received at an address latch 16 and the received address is decoded by the row decoder 18 which selects the word lines and the column decoder 20 which selects the bit lines of the memory array 12. The flash memory cells 14 in the array 12 are accessed by word lines WL0 to WLM and bit lines BL0 and BLN. The row decoder 18 selectively activates a word line from WL0 to WLM. The column decoder selectively activates a bit line from BL0 to BLN through the Y-gating circuit 22 to allow a memory cell 14 at the intersection of the selected word line and selected bit line to be accessed. To read data from or write data to the memory array 12, the Y-gating circuit 22 connects the bit lines to a write driver/sense amplifier circuit 24. In practice, the write driver and sense amplifier circuit 20 includes a bank of write drivers and sense amplifiers, one set of write driver and sense amplifier for each input/output (I/O) of the flash memory device. Each set of write driver and sense amplifier is coupled to a block of memory cells 14 in the cell array 12. For example, when the flash memory device 10 generates output data in K-bit (i.e. K-bit I/O), the write driver/sense amplifier circuit 24 may include K write drivers and K sense amplifiers, each write driver/sense amplifier circuit being coupled to a block of bits lines associated with a databit of the output data. The write driver and sense amplifier circuit 20 may be coupled to a page buffer 26 to receive program data to be written into the cell array 12 or to store read data read out from the cell array 12. The write driver and sense amplifier circuit 20 may be further coupled to an I/O buffer circuit 28 to provide read data from the cell array 12 to external circuits or to receive write data to be written into the cell array from external circuits. The memory architecture shown in FIG. 1 is illustrative only and it will be appreciated that the structure and methods described herein may be utilized in other memory architectures.

Furthermore, the memory array 12 may be arranged in sectors, blocks, or blanks. That is, the memory cells 14 may be arranged or grouped into sectors, blocks, or blanks. In one example, the cell array 12 includes multiple banks of memory cells, each bank for each input/output (I/O) of the flash memory device. For example, a flash memory device may have a 16-bit I/O or a 32-bit I/O and thus the cell array 12 of the flash memory device may be divided into 16 or 32 banks of memory cells.

Figure 2:
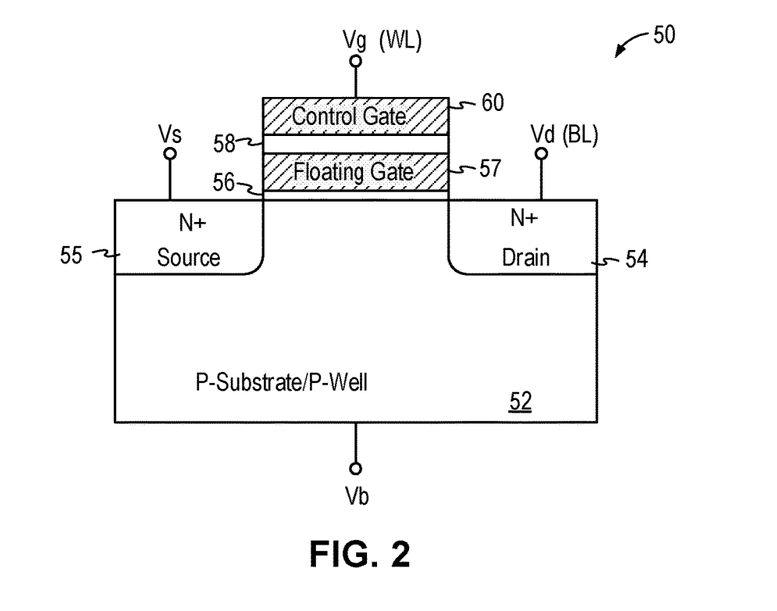
FIG. 2 is a cross-sectional view of a flash memory cell implemented using a floating gate MOS transistor device in some examples of the present invention.

In the present embodiment, flash memory cells 14 are implemented using a floating gate MOS transistor device, as shown in FIG. 2. Referring to FIG. 2, a floating gate MOS transistor device 50 includes a source region 55, a drain region 54, a control gate 60 and a floating gate 57. The source and drain regions are formed in a semiconductor layer 52 with the channel region disposed in between the source and the drain regions. In some examples, the semiconductor layer 52 can be a well region or a semiconductor substrate. In the present example, the floating gate MOS transistor device 50 is formed as an N-type device and the semiconductor layer 52 is a P-type well region with the source and drain regions being heavily doped N+ regions formed in the P-well region 52. The floating gate 57 and the control gate 60 are vertically disposed above the channel region and at least partially overlapped. The floating gate 57 is electrically isolated from the P-type well region 52 by a thin gate oxide layer 56 (also referred to as the "tunnel oxide layer") and is electrically isolated from the control gate 60 by another dielectric layer 58 which can be a dielectric film or a stack of different dielectric films. The control gate 60 of the floating gate MOS transistor device 50 is coupled to the word line of the cell array while the drain region is coupled to the bit line of the cell array. In a NOR flash memory, the source regions of the floating gate MOS transistor devices are connected to a shared source line which is typically connected to the ground potential.

The operation of the flash memory device 10 and the floating gate flash memory cell 50 is well known and will be described in brief. In the present example, the flash memory cell is adapted to store one bit of data. The flash memory cell has a logical state of "1" when the cell is erased and a logical state of "0" when the cell is programmed. It is understood that flash memory cells may be constructed to operate in the opposite logical states.

First, programming or writing data to the flash memory cell is performed by transferring charge carriers from the semiconductor layer 52 to the floating gate 57 by tunneling through the thin gate oxide layer 56. For example, an elevated gate voltage (e.g. Vg=12V) is applied to the control gate to turn on the channel and electrons can flow from the source to the drain. The P-well region 52 is typically grounded. An elevated drain voltage (e.g. Vd=5V) is applied to the drain region 54 relative to the source region 55 to generate electrons with sufficiently high energy ("hot electrons") so that hot electronic injection occurs and hot electrons jump through the thin gate oxide layer 56 onto the floating gate 57. When the biasing voltages are removed, the charges are trapped on the floating gate 57 and the memory cell is programmed to a logical state of 0.

Second, erasing the flash memory cell is performed by transferring charge carriers from the floating gate to the semiconductor layer 52 (or P-well 52) by quantum tunneling or Fowler-Nordheim tunneling. The erase operation can be carried out using source erase operation or channel erase. To perform source erase, an elevated negative voltage (e.g. Vg=−10V) is applied to the control gate 60 and the substrate is at ground. A positive voltage (e.g. Vd=6V) is applied to the source region 55 with the drain region 54 being grounded or floating. Electrons are pull off the floating gate into the source through quantum tunneling. When the floating gate is left with no charge carriers, the memory cell has a logical state of 1. To perform channel erase, an elevated negative voltage (e.g. Vg=−10V) is applied to the control gate 60 and a positive voltage (e.g. Vb=5V) is applied to the semiconductor layer or P-well 52. The source region 55 and the drain region 54 are left floating. Electrons are pull off the floating gate into the substrate through quantum tunneling. When the floating gate is left with no charge carriers, the memory cell has a logical state of 1.

Flash memory cells can be programmed individually but are usually erased as a block or a sector. Each erase operation includes the application of an erase pulse followed by an erase verify cycle to ensure that all memory cells are indeed erased. If some of the memory cells are not erased, then another erase pulse is applied and the process repeats until all memory cells are erased. In both source erase and channel erase operations, the magnitude and the duration of the voltage bias can vary and are selected to ensure that all memory cells in a sector a block are erased. In most cases, the flash memory device is erased using a repeated erase-verify operation when the memory cells are verified to be erased after an erase cycle and the erase cycle is repeated if not all memory cells are erased.

Finally, a flash memory cell is read by applying a gate voltage that is an intermediate threshold voltage of an erased memory cell and a programmed memory cell. When a flash memory cell is erased, the floating gate carries no charge and the memory cell transistor can be turned on by the application of a first threshold voltage. For example, the threshold voltage of an erased memory cell can be distributed in the range of +1V to +3V. When the flash memory cell is programmed, the negative charge on the floating gate screens the electric field from the control gate, the memory cell transistor thus requires a second threshold voltage higher than the first threshold voltage to turn on. For example, the threshold voltage of an erased memory cell can be distributed in the range of +7V to +9V. Thus, to read a flash memory cell, a gate voltage between the first and second threshold voltages are applied to the control gate and a drain voltage, smaller than the gate voltage, is applied to the drain. If a current is measured at the drain terminal, then the memory cell is not programmed and has a logical state of 1. If no current is measured at the drain terminal, then the memory cell is programmed and has a logical state of 0.

To access a flash memory cell in the cell array 12, an input address A[0-MX] (FIG. 1) is provided to flash memory device 10. The input address is latched by the address latch 16 and the latched address is divided into a row address which is coupled to the row decoder 16 and a column address which is coupled to the column decoder 18. Row decoder decodes the row address and activates one word line out of word lines WL0 to WLM and column decoder decodes the column address and activates one bit line out of bit lines BL0 to BLN. In this manner, the memory cell associated with the activated word line and the activated bit line is made available for either read, write or erase operation. In practice, the flash memory device activates the memory cells associated with all of the I/Os of the memory device. For example, the memory cells associated with one byte of data or eight I/Os, may be activated for access based on the input address. More specifically, the flash memory device activates one bit line for each associated write driver/sense amplifier in the flash memory device. In the following description, the operation of the flash memory device will be described with reference to a single write driver or a single sense amplifier or a single I/O. It is understood that the flash memory device may includes a bank of write drivers and a bank of sense amplifiers for a set of I/Os, such as a byte of data.

In the flash memory device 10, to read out data from a flash memory cell 14, a memory cell is selected by activating a respective word line and a respective bit line and the current that flows in the memory cell is measured. The current that flows through the memory cell is measured at the drain terminal which is coupled to the bit line. The amount of current that flows through the selected memory cell is a function of the logical state of the memory cell. In the present example, if a current above a certain threshold is measured at the drain terminal, then the memory cell is not programmed and has a logical state of 1. On the other hand, if no current is measured at the drain terminal, then the memory cell is programmed and has a logical state of 0. Drain current also flows in the memory cell during the programming operation of the memory cell. In the present description, the current that flows through a memory cell when the control gate of the memory cell is biased is referred to as the "cell current" or the "bit line current."

Referring still to FIG. 1, a control circuit 30 controls the operation of the flash memory device 10. In particular, the control circuit 30 receives an input address (Addr), an input command (Command) and a clock signal (CLK). The control circuit 30 generates internal signals in response to the received input signals to control the operations of the flash memory device 10.

In embodiments of the present invention, the flash memory device 10 incorporates an embedded transconductance (GM) test circuit 35 for performing transconductance testing on the memory cells 14 in the cell array 12 to detect for low $g_m$ memory cells. In some embodiments, the embedded GM test circuit 35 is implemented as a logic circuit including logic circuit elements and/or storage elements. The embedded GM test circuit 35 is in communication with the control circuit 30 to direct the control circuit to carry out the transconductance test method on the memory cells 14 in accordance with embodiments of the present invention. For example, the embedded GM test circuit 35 can be initiated during wafer sort testing to perform the transconductance test method on the memory cells to detect for low $g_m$ memory cells.

In the present embodiment, the embedded GM test circuit 35 is illustrated as being a separate logic circuit apart from the control circuit 30. The configuration of the embedded GM test circuit 35 in FIG. 1 is illustrative only and not intended to be limiting. In other embodiments, the embedded GM test circuit 35 may be formed as part of the control circuit 30. The exact configuration of the embedded GM test circuit 35 is not critical to the practice of the present invention.

The memory cells 14 in the cell array 12 are characterized by the transconductance ($g_m$) value which relates the cell current $I_{cell}$ flowing through the memory cell to the gate voltage $V_{GS}$ applied to the control gate of the memory cell. In particular, the transconductance ($g_m$) measures the change in the drain current or cell current of the floating gate MOS device to the change in gate voltage over a small interval on the cell-current-versus-gate-voltage curve. In other words, the transconductance ($g_m$) of a memory cell measures the slope of the cell current vs. gate bias curve of the memory cell. The transconductance values among the memory cells 14 in the cell array 12 vary due to fabrication process variations.

Figure 3:
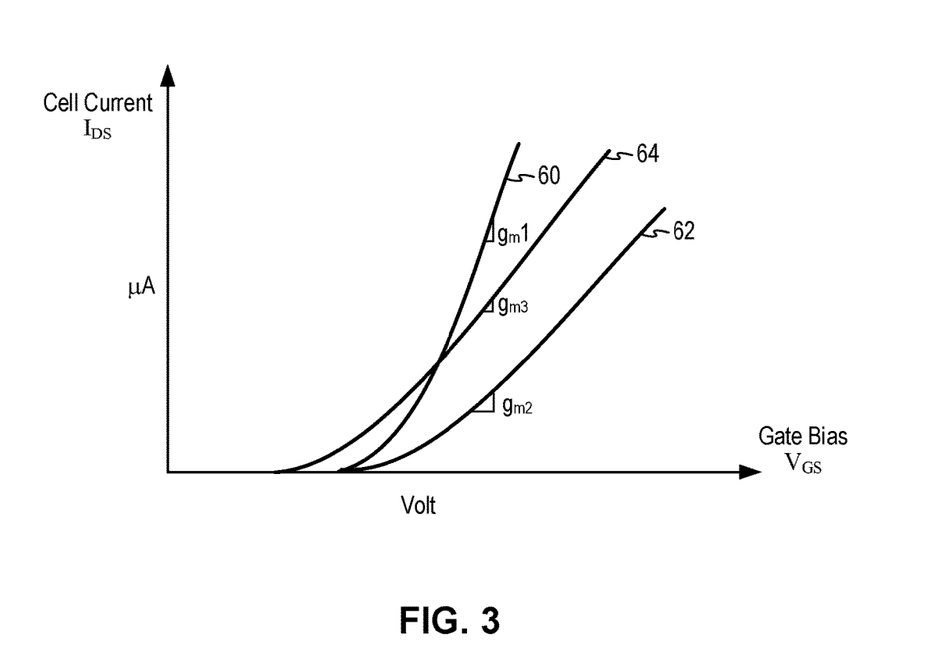
FIG. 3 is a plot illustrating the cell current versus gate bias voltage of several representative memory cells in the flash memory device in some examples.

FIG. 3 is a plot illustrating the cell current versus gate bias voltage of several representative memory cells in the flash memory device in some examples. Referring to FIG. 3, curves 60, 62 and 64 illustrate the cell current $I_{cell}$ vs. gate bias voltage $V_{GS}$ curves for three representative memory cells 14 in the cell array 12 of the flash memory device 10 of FIG. 1. In particular, the cell current $I_{cell}$ vs. gate bias voltage $V_{GS}$ curves shown in FIG. 3 illustrate the current-voltage (I-V) characteristic of flash memory cells that have been erased. The transconductance ($g_m$) of each memory cell is measured by the slope of the $I_{cell}$ vs. $V_{GS}$ curves 60, 62 and 64. Due to fabrication process variations, memory cells in the same cell array may have a distribution of transconductance values. For example, the memory cell associated with curve 60 may have a transconductance value of $g_m1$, which is larger than the transconductance value $g_m2$ and $g_m3$ associated with curves 62 and 64. Large or high transconductance values are acceptable. However, low transconductance values can lead to reliability problem for the flash memory device after many operating cycles. In some cases, the transconductance value $g_m3$, although appear to be low, but may be acceptable as the memory cell may merely have a lower erase threshold voltage. Meanwhile, the transconductance value $g_m2$ may be too low and may cause reliability issue in the flash memory device if not screened out.

In embodiments of the present invention, the embedded transconductance test circuit 35 implements a transconductance test method to detect memory cells with low transconductance values. The low $g_m$ memory cells thus detected can be repaired, if eligible. If not repairable, the flash memory device with the low $g_m$ memory cells can be screened out, such as during wafer sort testing.

Figure 4:
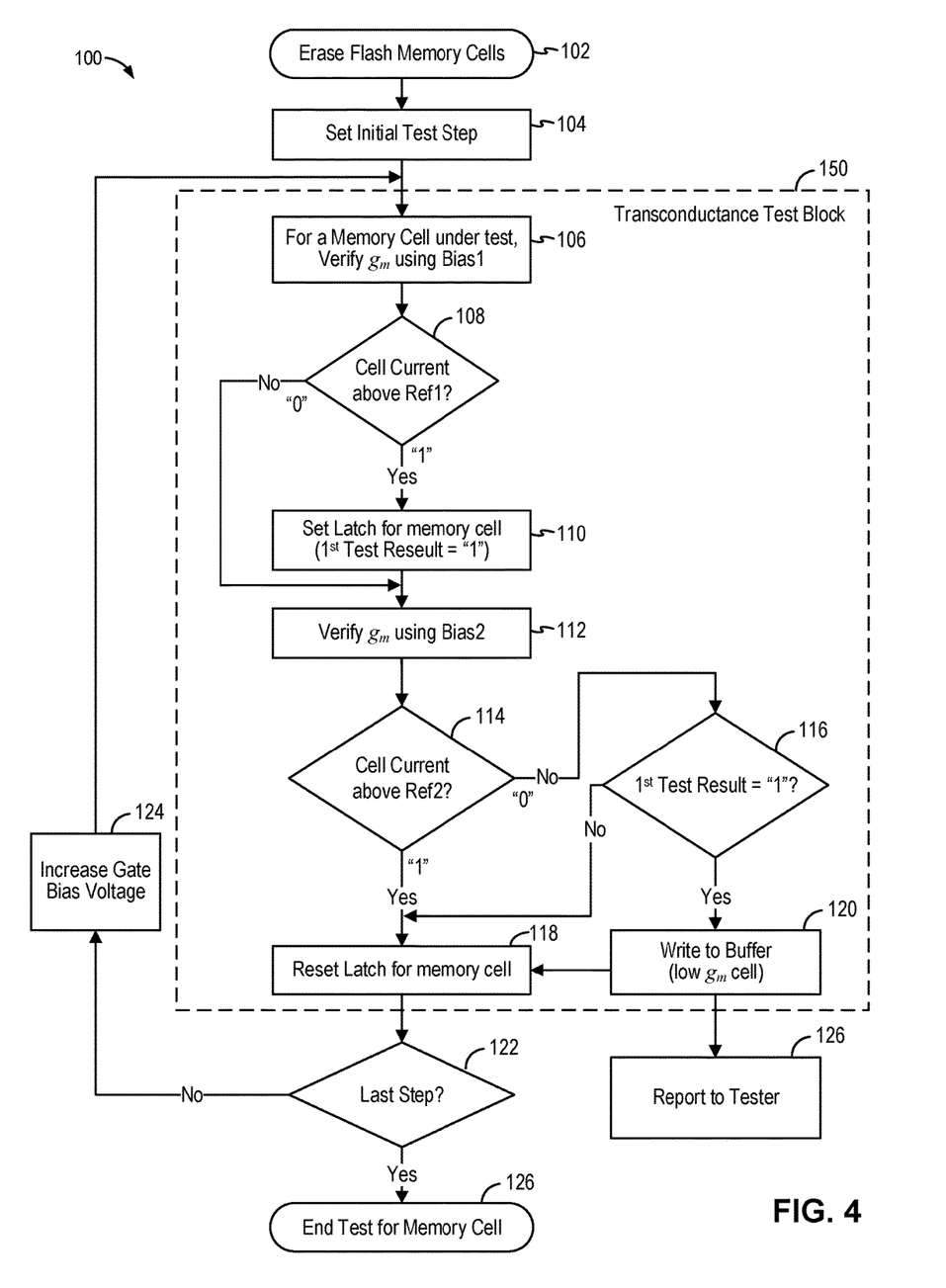
FIG. 4 is a flowchart illustrating a transconductance test method in embodiments of the present invention.

FIG. 4 is a flowchart illustrating a transconductance test method in embodiments of the present invention. In some embodiments, the transconductance test method can be implemented in the embedded transconductance test circuit 35 of the flash memory device 10 to detect memory cells with low transconductance. The transconductance test method provides an output identifying memory cells, if any, having been classified as having a low transconductance (low $g_m$). In embodiments of the present invention, the transconductance test method is implemented using a multi-step test scheme using a pair of gate bias levels for each test step.

Furthermore, in embodiments of the present invention, the transconductance test method is carried out to test each memory cell in a cell array. The testing can be performed at the cell level, or on a sector level, a block level, or a bank level, or on the chip level. The exact order or arrangement for testing the memory cells in the cell array is not critical to the practice of the present invention.

Figure 5:
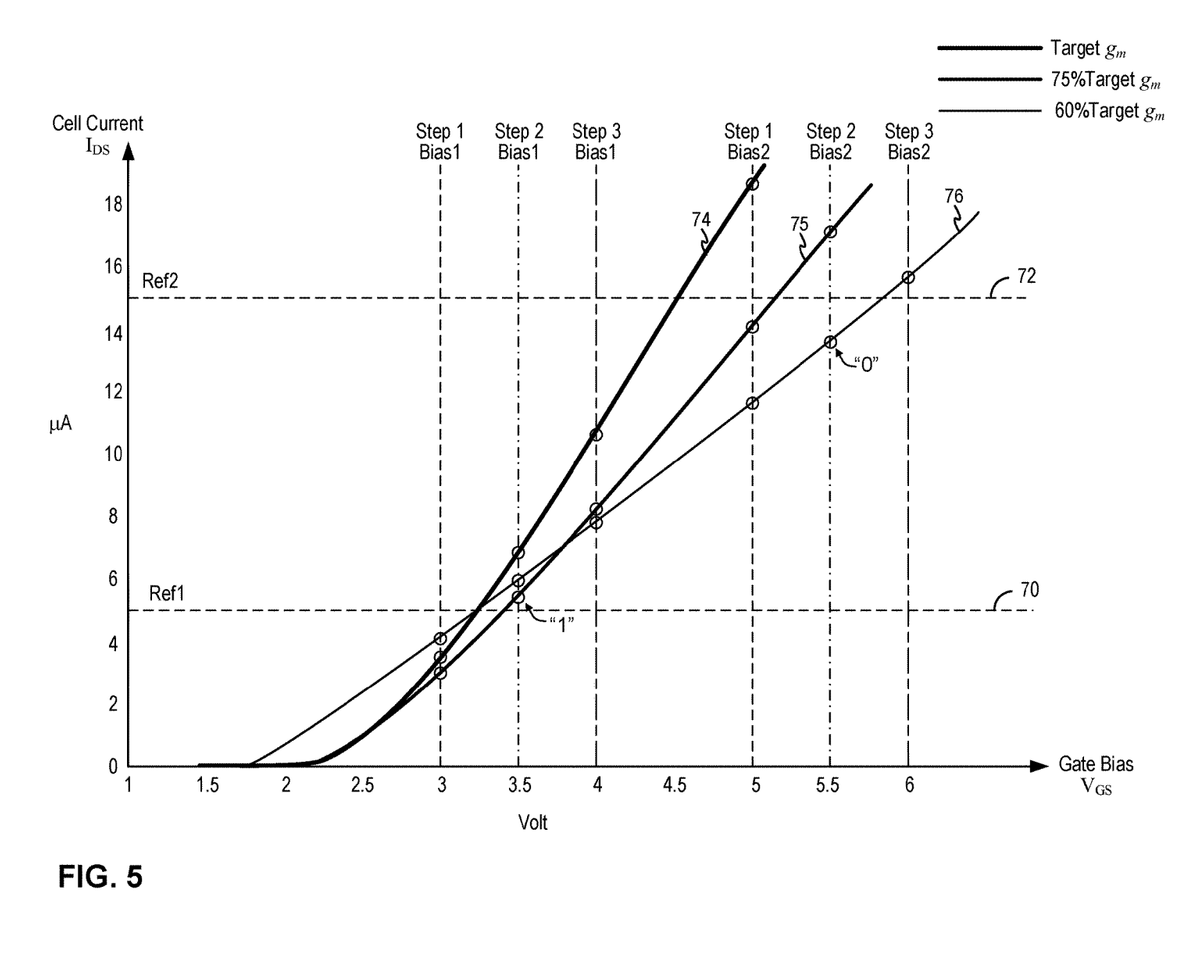
FIG. 5 is a plot illustrating the cell current versus gate bias voltage of several representative memory cells in the flash memory device and illustrating the operation of the transconductance test method in embodiments of the present invention.

The operation of the transconductance test method 100 will be described with reference to FIG. 5. FIG. 5 is a plot illustrating the cell current versus gate bias voltage of several representative memory cells in the flash memory device and illustrating the operation of the transconductance test method in embodiments of the present invention. More specifically, in the embodiment shown in FIG. 5, the transconductance test method implements a three-step test scheme using a pair of gate bias levels at each step.

Referring to FIGS. 4 and 5, the transconductance test method 100 is executed after the flash memory cells have been erased or during the erase operation of the flash memory cells (102). In some embodiments, the transconductance test method 100 is initiated during the wafer sort testing of the flash memory device and the transconductance test method 100 is therefore executed during wafer sort testing. In particular, FIG. 4 illustrates the transconductance test method 100 being applied to a memory cell under test. The transconductance test method 100 can be applied to each memory cell in the cell array. Alternately, the transconductance test method 100 can be applied to a subset of the memory cells only, as explained in more detail below.

The transconductance test method 100 sets the initial test step (Step 1) (104). At 106, for a selected memory cell, the transconductance test method 100 verifies the transconductance of the memory cell using a first bias level (Bias1) of the present test step (Step1). For example, as shown in FIG. 5, the first bias level Bias1 for Step 1 is a gate bias voltage of 3V. The method 100 measures the cell current at the Step 1, Bias1 gate voltage level. At 108, the method 100 determines whether the cell current at the Step 1, Bias1 gate voltage level is greater than a first current reference level Ref1 (FIG. 5, curve 70). For example, the first current reference level Ref1 may be 5 µA.

If the cell current measured for the memory cell is greater than the first reference level Ref1, an indicator for the memory cell is recorded (110). If the cell current measured for the memory cell is less than the first reference level Ref1, the method 100 bypasses box 110.

In some examples, the indicator may be stored in a latch. The latch may be initially reset and the latch cell associated with the memory cell is set in response to detecting that the cell current at the Bias1 gate voltage being greater than the first reference level Ref1. Alternately, the indicator can be stored in a buffer. The buffer may be initialized to a first value and is set to a second value in response to detecting that the cell current at the Bias1 gate voltage being greater than the first reference level Ref1. In the present description, the latch for the memory cell is initialized to a first logical value of "0" and the latch is set to a second logical value of "1" in response to detecting that the cell current at the Bias1 gate voltage being greater than the first reference level Ref1. In other embodiments, other logical values may be used.

Furthermore, for the convenience of description, the decision boxes, such as box 108, are described as providing a logical "1" value for a Yes result and a logical "0" value for a No result. Accordingly, the decision box 108 is said to provide a logical "1" result value in response to detecting that the cell current at the Bias1 gate voltage being greater than the first reference level Ref1 and a logical "0" result value in response to detecting that the cell current at the Bias1 gate voltage being less than the first reference level Ref1. The same logical value convention will be used for the following description of FIG. 4.

Accordingly, in the case where the memory cell has a cell current that is greater than the first reference level Ref1 at the first bias level Bias1, the result value is a logical "1". Meanwhile, in the case where the memory cell has a cell current that is less than the first reference level Ref1 at the first bias level Bias1, the result value is a logical "0". In the present embodiment, the latch is set for the memory cell for the logical "1" result value. It is understood the logical result values used herein are illustrative only. The logical result values are only used to illustrate the method of the present invention and not intended to be limiting.

After the cell current comparison (108) and the setting of the latch (110), where applicable, the method 100 continues to 112 to verify the transconductance of the memory cell using a second bias level (Bias2) of the present test step (Step1). For example, as shown in FIG. 5, the second bias level Bias2 for Step 1 is a gate bias voltage of 5V. The method 100 measures the cell current at the Step 1, Bias2 gate voltage level. At 114, the method 100 determines if the cell current at the Step 1, Bias2 gate voltage level is greater than a second current reference level Ref2 (FIG. 5, curve 72). For example, the second current reference level Ref2 may be 15 µA.

If the cell current measured for the memory cell is greater than the second reference level Ref2 (logical "1" result value), the method 100 determines that the memory cell has an acceptable transconductance value for this test step and the method 100 proceed to 118 to reset the latch for the memory cell to the initial value.

Alternately, if the cell current measured for the memory cell is less than the second reference level Ref2 (logical "0" result value), the method 100 checks if the latch for the memory cell has been set (116). That is, the method 100 checks to see if the first test result using gate voltage level Bias1 and reference level Ref1 has a logical "1" result value. In the case the first test result has the logical "1" result value, the method 100 determines that the memory cell has a low transconductance value. In other words, the method 100 determines a memory cell to be a low transconductance memory cell when the first test result (Bias1, Ref1) has a "1" result and the second test result (Bias2, Ref2) has a "0" result.

The method 100 writes the address of the low transconductance memory cell to a memory, such as the page buffer of the flash memory device (120). After recording the memory cell address for the low $g_m$ memory cell, the method 100 continues to 118 to reset the latch for the memory cell.

The method 100 then continues to determine if the current step is the last step of the transconductance testing (122). In the event that the current step is not the last step, the method 100 increments to the next step and increases the gate bias voltage (124). The method 100 then repeats at 106 to verify the transconductance of the memory cell using the first bias level (Bias1) of the present test step (Step2). For example, as shown in FIG. 5, the first bias level Bias1 for Step 2 is a gate bias voltage of 3.5V. The method 100 proceeds to measure the cell current at the Step 2, Bias1 gate voltage level and to measure the cell current at the Step 2, Bias2 gate voltage level (e.g. 5.5V). The method 100 determines the memory cell is a low $g_m$ memory cell at this test step (step 2) when the memory cell has a cell current that is greater than the first reference level Ref1 at the Bias1 level ($1^{st}$ test result logical "1") but the cell current is lower than the second reference level Ref2 at the Bias2 level ($2^{nd}$ test result logical "0"). The method 100 then writes the address of the memory cell to the memory (120). After recording the memory cell address for the low $g_m$ memory cell, the method 100 continues to 118 to reset the latch for the memory cell.

The method 100 may be repeated again for additional test steps to evaluate the memory cell to determine if the memory cell is a low $g_m$ memory cell. For example, in the embodiment shown in FIG. 5, the method 100 implements a third test step having a first bias level Bias1 at 4V and a second bias level Bias2 at 6V.

After the last test step is completed, the method 100 ends for the selected memory cell (126). The method 100 may then repeat for the next memory cell in the cell array. At the completion of the testing, the method 100 may report the test result to a tester (130). In particular, the memory cell locations or addresses associated with low $g_m$ memory cells may be reported to the tester. The tester may determine if the low $g_m$ memory cells can be repaired or if the flash memory device has to be screened out.

In some embodiments, the first bias level for each test step is selected from the erase threshold voltage distribution and the second bias level for the respective test step is the first bias level plus a predetermined voltage margin.

In some embodiments, the Bias1 and Bias2 voltage levels, the number of test steps, the first and second reference levels Ref1 and Ref2 are programmable and can be selected or modified using a CAM or by placing the flash memory device in the test mode. The specific values for Bias1, Bias2, Ref1 and Ref2 and the number of test steps described herein are illustrative only and not intended to be limiting.

The transconductance test method 100 of the present invention realizes advantages over conventional test method as the method 100 does not require the current readings to be read out of the flash memory device and stored on the tester. The method 100 is embedded in the flash memory device and the transconductance testing can be performed by the logic circuits in the flash memory device and only the failed memory locations are read out to the tester. The transconductance test method 100 of the present invention can perform the transconductance testing faster and without burdening the wafer sort tester.

Furthermore, the transconductance test method 100 of the present invention improves detection accuracy by using multiple test steps, each successive step with higher gate bias voltages. Because the I-V characteristics of the flash memory cell is not linear, performing multiple test steps improves the ability to detect a low transconductance memory cell. The transconductance of the memory cell is measured over a range of gate bias voltages to ensure that all memory cells with low transconductance can be detected.

FIG. 5 illustrates the I-V curves for several exemplary memory cells. Referring first to curve 74, for this memory cell, the current level at Bias1 of Step 1 is lower than the first reference level Ref1 and the memory cell is not tested at the Bias2 level. The memory cell is then tested at the Bias1 level for Step 2 and the current level is higher than the Ref1 level and the latch for the memory cell is set. The memory cell is then tested at the Bias2 level at Step 2 and the current level is also higher than the Ref2 level. In that case, the memory cell is deemed to have good transconductance value and the latch for the memory cell is reset. The memory cell for curve 74 is then tested at Step 3 and the memory cell has current values greater than the Ref1 and Ref2 levels at the respective bias level. In that case, the memory cell (curve 74) is deemed to have good transconductance value and the latch for the memory cell is reset.

Referring to curve 75, for this memory cell, the current level at Bias1 of Step 1 is lower than the first reference level Ref1 and the memory cell is not tested at the Bias2 level. The memory cell is then tested at the Bias1 level for Step 2 and the current level is higher than the Ref1 level and the latch for the memory cell is set. The memory cell is then tested at the Bias2 level at Step 2 and the current level is also higher than the Ref2 level. In that case, the memory cell is deemed to have good transconductance value and the latch for the memory cell is reset. The memory cell for curve 75 is then tested at Step 3 and the memory cell has current values greater than the Ref1 and Ref2 levels at the respective bias level. In that case, the memory cell (curve 75) is deemed to have good transconductance value and the latch for the memory cell is reset.

Referring to curve 76, for this memory cell, the current level at Bias1 of Step 1 is lower than the first reference level Ref1 and the memory cell is not tested at the Bias2 level. The memory cell is then tested at the Bias1 level for Step 2 and the current level is higher than the Ref1 level and the latch for the memory cell is set. The memory cell is then tested at the Bias2 level at Step 2. In this case, the current level is lower than the Ref2 level. The method thus detected the memory cell (curve 76) to have a low transconductance value and the memory location or address is written to the buffer. The memory cell for curve 74 is then tested at Step 3 and the memory cell has current values greater than the Ref1 and Ref2 levels at the respective bias level. Although the memory cell in this case passes the tests at Steps 1 and 3, the Step 2 test is able to detect that the memory cell has a low transconductance value and the memory cell is recorded as such.

In the examples shown in FIG. 5, curve 74 is associated with a memory cell having the target transconductance, curve 75 is associated with a memory cell having a transconductance value at 75% of the target, and curve 76 is associated with a memory cell having a transconductance value at 60% of the target. By selecting the appropriate voltage values for the bias levels and the reference current levels, the transconductance test method of the present invention is able to accurately detect memory cells with a transconductance value 60% or lower than the target value.

Figure 6:
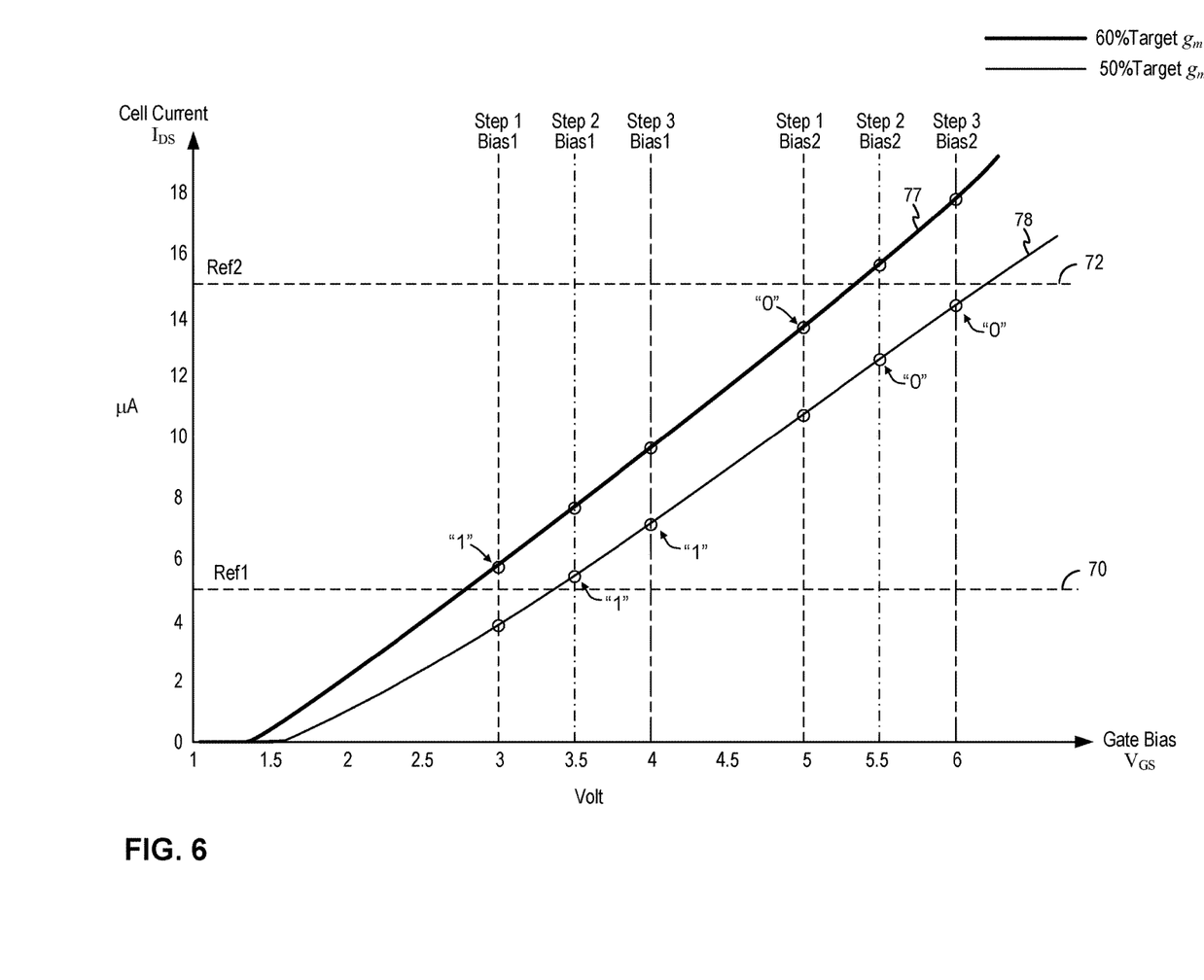
FIG. 6 illustrates the I-V curves for several additional exemplary memory cells.

FIG. 6 illustrates the I-V curves for several additional exemplary memory cells. Referring to curve 77, for this memory cell, the current level at Bias1 of Step 1 is greater than the first reference level Ref1 and the memory cell is tested at Bias2 of Step 1. In this case, the current level is lower than the Ref2 level. The method thus detected the memory cell (curve 77) to have a low transconductance value and the memory location or address is written to the buffer. The memory cell for curve 77 can be tested at Steps 2 and 3. Although the memory cell in this case passes the tests at Steps 2 and 3, the Step 1 test is able to detect that the memory cell has a low transconductance value and the memory cell is recorded as such. In this case, curve 76 is associated with a memory cell having a transconductance value at 60% of the target.

Referring to curve 78, for this memory cell, the current level at Bias1 of Step 1 is lower than the first reference level Ref1 and the memory cell is not tested at the Bias2 level. The memory cell is then tested at the Bias1 level for Step 2 and the current level is higher than the Ref1 level and the latch for the memory cell is set. The memory cell is then tested at the Bias2 level at Step 2. In this case, the current level is lower than the Ref2 level. The method thus detected the memory cell (curve 78) to have a low transconductance value and the memory location or address is written to the buffer. The memory cell for curve 78 is then tested at Step 3 and the memory cell has current values greater than the Ref1 but lower than Ref2 at the respective bias level. In this case, the tests at Steps 2 and 3 both indicate that the memory cell (curve 78) has a low transconductance value and the memory cell is recorded as such. In this case, curve 76 is associated with a memory cell having a transconductance value at 50% of the target.

Referring back to FIG. 4, the transconductance test method 100 illustrates the steps for testing a single memory cell. In particular, the steps 106 to 118 of the transconductance test method 100 form a transconductance test block 150 for testing the transconductance of a memory cell. The transconductance test method 100 can be configured in various manner to apply the transconductance test method to test memory cells in the cell array. For example, the transconductance test method can be applied to test the memory cells along a column or along a row. Furthermore, the transconductance test method can be applied to test each memory cell at all the test steps or to test a block of memory cell at each test step.

Figure 7:
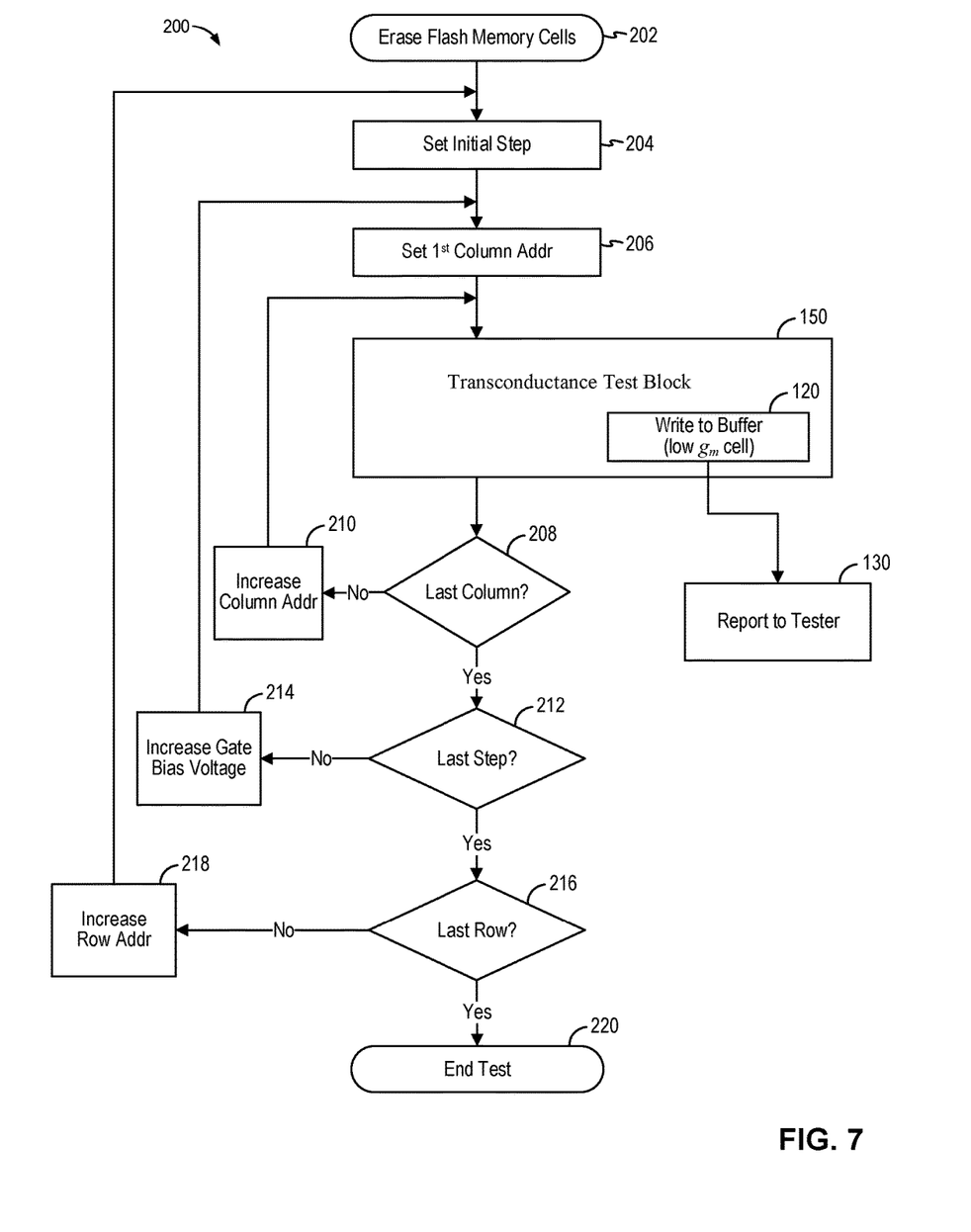
FIG. 7 is a flowchart illustrating the transconductance test method in embodiments of the present invention.

FIG. 7 is a flowchart illustrating the transconductance test method in embodiments of the present invention. In particular, FIG. 7 illustrates a transconductance test method that tests all memory cells in a row for each respective test step before proceeding to the next test step. Referring to FIG. 7, a transconductance test method 200 starts after the flash memory cells have been erased or during the erase operation of the flash memory cells (202). The method 200 set the test step to the initial step (Step 1) (204). The method 200 then set the first column address (206). The method 200 then performs the current verification steps in the transconductance test block 150 (FIG. 4) for the memory cell in the selected column at the present test step. The method 200 continues to the next column after each column of memory cells has been tested (208, 210), until the last column is reached (208). After the last column of memory cells have been tested, the method 200 continues to the next test step (212) where the bias voltages are increased (214). The method 200 repeats again at the first column address and the memory cells are again tested on a column by column basis. During each test step, memory cells detected to have low transconductance will have their addresses stored in the memory (120). When the last test step has been performed (212), the method 200 continues to the next row of memory cells (216, 218), until the last row is reached and the test is completed (220).

Figure 8:
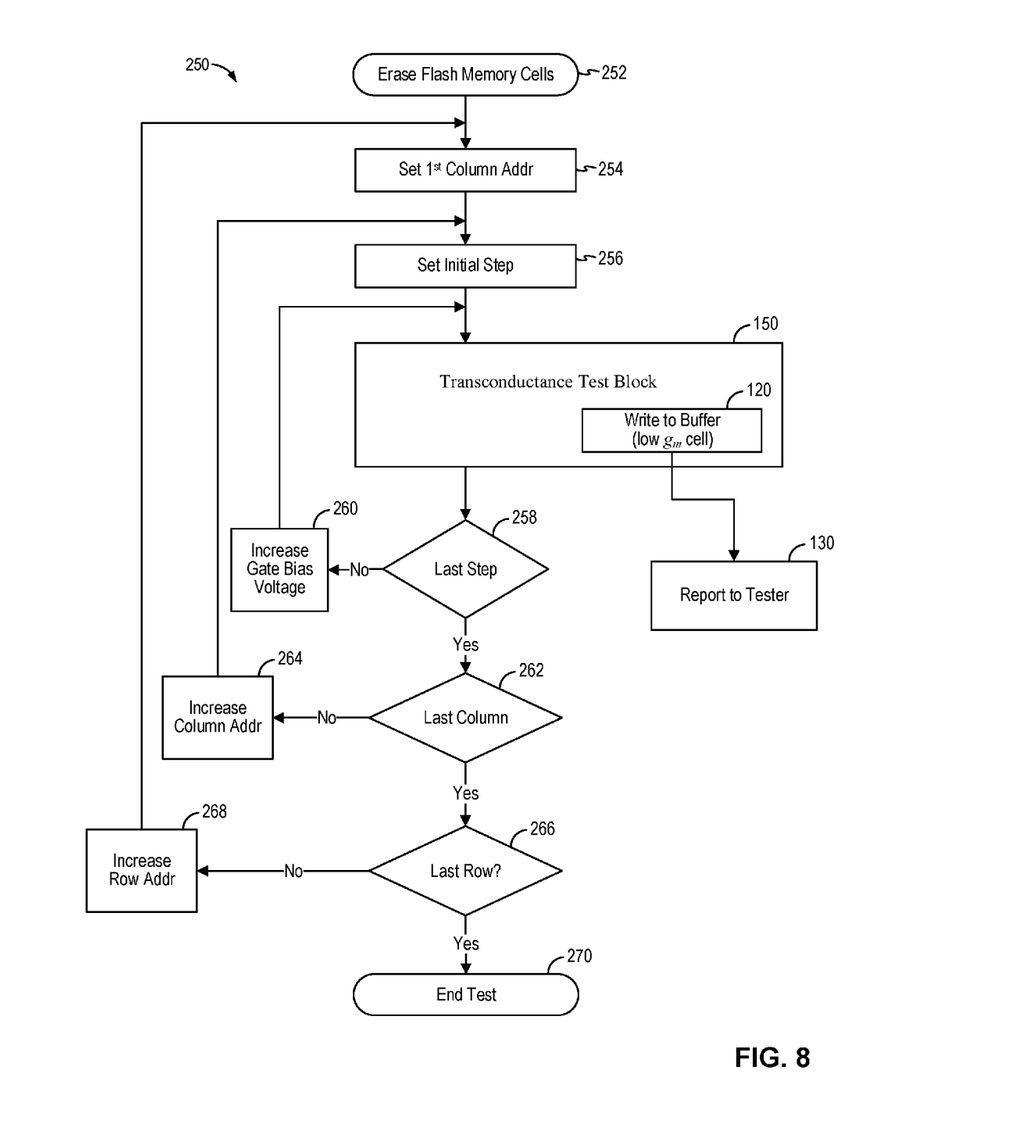
FIG. 8 is a flowchart illustrating the transconductance test method in embodiments of the present invention.

FIG. 8 is a flowchart illustrating the transconductance test method in embodiments of the present invention. In particular, FIG. 8 illustrates a transconductance test method that tests each memory cell for all the test steps before proceeding to the next memory cell in the row. Referring to FIG. 7, a transconductance test method 250 starts after the flash memory cells have been erased or during the erase operation of the flash memory cells (252). The method 250 set the first column address (254). The method 250 then set the test step to the initial step (Step 1) (256). The method 200 then performs the current verification steps in the transconductance test block 150 (FIG. 4) for the memory cell in the selected column at the present test step. The method 200 continues to the next test step (258) for the same memory cell and increases the gate bias voltage (260), until all the test steps have been applied (258). The method 250 then increments the column of the memory cell (262, 264), until the last column is reached (262). After the last column of memory cells have been tested, the method 250 continues to the next row of memory cells (266, 268), until the last row is reached and the test is completed (270).

FIGS. 7 and 8 illustrate exemplary embodiments of the transconductance test method. FIGS. 7 and 8 are illustrative only and not intended to be limiting. It is understood that other arrangement of the transconductance test method can be used. The transconductance test method can be arranged to test each memory cell at all the test steps or a section of memory cells at each test step before incrementing to the next test steps. Other modifications to the arrangement of the transconductance test method are possible.

Furthermore, in embodiments of the present invention, the transconductance test method may be applied to test memory cells and upon detecting a memory cell having low transconductance, the transconductance test method is stopped for the remaining memory cell along the same column. In particular, in some flash memory devices, such as NOR flash memory devices, the flash memory device may employ a column based repair scheme. In that case, memory cell repair is applied to the whole column of memory cells. Therefore, once a low $g_m$ memory cell is detected in a column, testing of the remaining memory cell in the same column is not necessary as the entire column will be replaced in the repair. In this manner, the transconductance test method can save test time by skipping memory cells that do not need to be tested.

Figure 9:
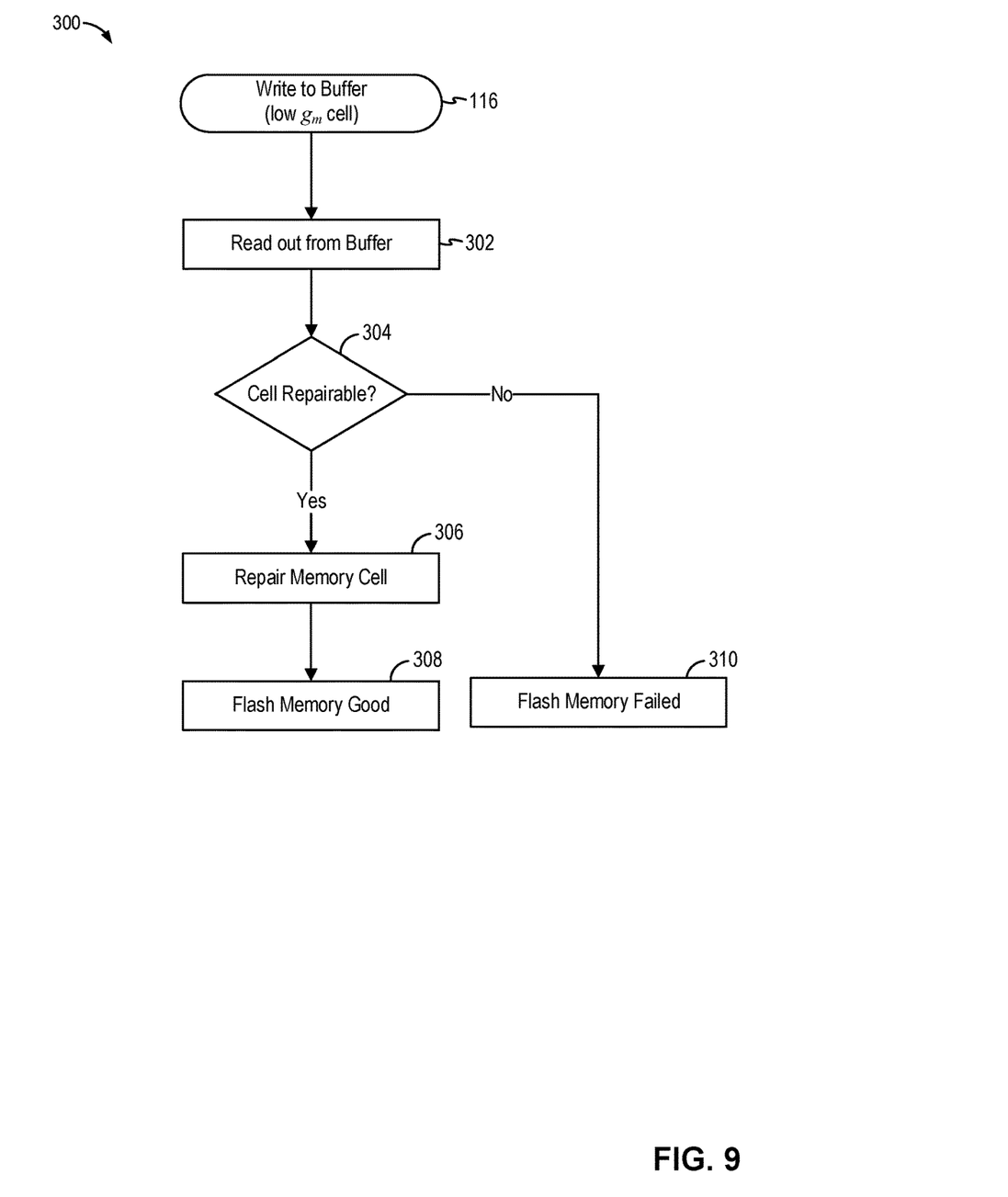
FIG. 9 is a flowchart illustrating the tester side operation in some embodiments.

FIG. 9 is a flowchart illustrating the tester side operation in some embodiments. Referring to FIG. 9, a tester method 300 read out the detection data from the memory of the flash memory device (302). That is, from the transconductance test method, memory cell addresses or locations for low $g_m$ memory cells are stored in the memory, such as the page buffer of the flash memory device. The tester method 300 reads out the stored data in the memory to retrieves the detection data indicating the memory cell addresses with associated low $g_m$ memory cells. The tester method 300 determines whether the low $g_m$ memory cells are repairable (304). If repair is not possible, then the flash memory device is deemed to have failed the wafer sort test and is screened out. If repair is possible, the tester method 300 repairs the low $g_m$ memory cells (306). After verifying the repair, the tester method 300 can classify the flash memory device as passing the wafer sort test (308).

The above detailed descriptions are provided to illustrate specific embodiments of the present invention and are not intended to be limiting. Numerous modifications and variations within the scope of the present invention are possible. The present invention is defined by the appended claims.

What is claimed is:

1. A transconductance test method implemented in a flash memory device, the flash memory device comprising a two-dimensional array of memory cells, the method comprising:
    after an erase operation applied to one or more memory cells of the flash memory device, selecting a first test step as a present test step;
    applying a first bias level of the present test step to a control terminal of a selected memory cell;
    measuring a cell current of the selected memory cell in response to the first bias level of the present test step being applied to the control terminal;
    determining if the cell current is greater than a first reference level;
    in response to the cell current being greater than the first reference level, setting an indicator for the selected memory cell;
    applying a second bias level of the present test step to the control terminal of the selected memory cell, the second bias level being the first bias level plus a predetermined margin;
    measuring the cell current of the selected memory cell in response to the second bias level of the present test step being applied to the control terminal;
    determining if the cell current is greater than a second reference level, the second reference level being greater than the first reference level; and
    in response to the indicator for the selected memory cell being set and in response to the cell current being less than the second reference level, storing a memory cell address associated with the selected memory cell in a memory, the stored memory cell address indicating the selected memory cell has been detected to have a low transconductance value.

2. The method of claim 1, further comprising:
    in response to the cell current being greater than the second reference level or in response to storing of the selected memory cell address in the memory, resetting the indicator for the selected memory cell;
    incrementing the present test step to select the next test step, the next test step having a first bias level greater than the first bias level of the previous test step, and a second bias level being greater than the second bias level of the previous test step;
    in response to selecting the next test step, repeating applying the first bias level of the present test step to the control terminal of the selected memory cell to storing the memory cell address in response to the indicator for the selected memory cell being set and the cell current being less than the second reference level; and
    repeating incrementing the present test step until the last test step.

3. The method of claim 1, further comprising:
    providing the stored memory cell address to a wafer sort tester.

4. The method of claim 2, wherein resetting the indicator for the selected memory cell comprises resetting the latch associated with the selected memory cell to a first logical value; and setting an indicator for the selected memory cell comprises setting a latch associated with the selected memory cell to a second logical value.

5. The method of claim 1, wherein storing the memory cell address associated with the selected memory cell in a memory comprises storing the memory cell address associated with the selected memory cell in a page buffer of the flash memory device.

6. The method of claim 1, wherein the first bias level comprises a voltage selecting from a distribution of an erase threshold voltage of the memory cells of the flash memory device.

7. The method of claim 2, further comprising:
applying the first bias level and/or the second bias level of all of the test steps to the selected memory cell;
selecting the next memory cell in a same row in the two-dimensional array as the selected memory cell; and
repeating applying the first bias level and/or the second bias level of all of the test steps to the selected memory cell.

8. The method of claim 2, further comprising:
applying the first bias level and/or the second bias level of the present test step to the selected memory cell;
selecting the next memory cell in a same row in the two-dimensional array as the selected memory cell;
applying the first bias level and/or the second bias level of the present test step to the selected memory cell;
in response to the last memory cell in the same row being selected, incrementing the present test step to select the next test step; and
repeating applying the first bias level and/or the second bias level of the present test step to the selected memory cell.

9. The method of claim 1, further comprising:
in response to the selected memory cell being detected to have the low transconductance value, stopping testing of memory cells in a same column of the selected memory cell.

10. A flash memory device, comprising:
a two-dimensional array of memory cells; and
a transconductance test circuit being a logic circuit configured to detect a memory cell having a low transconductance value, the transconductance test circuit being configured to:
after an erase operation applied to one or more memory cells of the flash memory device, select a first test step as a present test step;
apply a first bias level of the present test step to a control terminal of a selected memory cell;
measure a cell current of the selected memory cell in response to the first bias level of the present test step being applied to the control terminal;
determine if the cell current is greater than a first reference level;
in response to the cell current being greater than the first reference level, set an indicator for the selected memory cell;
apply a second bias level of the present test step to the control terminal of the selected memory cell, the second bias level being the first bias level plus a predetermined margin;
measure the cell current of the selected memory cell in response to the second bias level of the present test step being applied to the control terminal;
determine if the cell current is greater than a second reference level, the second reference level being greater than the first reference level; and
in response to the indicator for the selected memory cell being set and in response to the cell current being less than the second reference level, store a memory cell address associated with the selected memory cell in a memory, the stored memory cell address indicating the selected memory cell has been detected to have the low transconductance value.

11. The flash memory device of claim 10, wherein the transconductance test circuit is further configured to:
in response to the cell current being greater than the second reference level or in response to storing of the selected memory cell address in the memory, reset the indicator for the selected memory cell;
increment the present test step to select the next test step, the next test step having a first bias level greater than the first bias level of the previous test step, and a second bias level being greater than the second bias level of the previous test step;
in response to selecting the next test step, repeat applying the first bias level of the present test step to the control terminal of the selected memory cell to storing the memory cell address in response to the cell current being less than the second reference level; and
repeating incrementing the present test step until the last test step.

12. The flash memory device of claim 10, wherein the transconductance test circuit is further configured to providing the stored memory cell address to a wafer sort tester.

13. The flash memory device of claim 11, wherein the transconductance test circuit is further configured to:
set a latch associated with the selected memory cell to a second logical value as the indicator; and
reset the latch associated with the selected memory cell to a first logical value to reset the indicator.

14. The flash memory device of claim 10, wherein the transconductance test circuit is further configured to store the memory cell address associated with the selected memory cell in a page buffer of the flash memory device.

15. The flash memory device of claim 10, wherein the first bias level comprises a voltage selecting from a distribution of an erase threshold voltage of the memory cells of the flash memory device.

16. The flash memory device of claim 11, wherein the transconductance test circuit is further configured to:
apply the first bias level and/or the second bias level of all of the test steps to the selected memory cell;
select the next memory cell in a same row in the two-dimensional array as the selected memory cell; and
repeat applying the first bias level and/or the second bias level of all of the test steps to the selected memory cell.

17. The flash memory device of claim 11, wherein the transconductance test circuit is further configured to:
apply the first bias level and/or the second bias level of the present test step to the selected memory cell;
select the next memory cell in a same row in the two-dimensional array as the selected memory cell;
apply the first bias level and/or the second bias level of the present test step to the selected memory cell;
in response to the last memory cell in the same row being selected, increment the present test step to select the next test step; and
repeat applying the first bias level and/or the second bias level of the present test step to the selected memory cell.

18. The flash memory device of claim 10, wherein the transconductance test circuit is further configured to:
in response to the selected memory cell being detected to have the low transconductance value, stop testing of memory cells in a same column of the selected memory cell.

* * * * *